(12) United States Patent
Ingeström et al.

(10) Patent No.: US 8,081,406 B2
(45) Date of Patent: Dec. 20, 2011

(54) THYRISTOR CONTROLLED SERIES CAPACITOR MODULE

(75) Inventors: Gunnar Ingeström, Västerås (SE);
Tomas Jonsson, Västerås (SE)

(73) Assignee: ABB Research Ltd., Linköping (SE)

( * ) Notice: Subject to any disclaimer, the term of this patent is extended or adjusted under 35 U.S.C. 154(b) by 700 days.

(21) Appl. No.: 12/159,766

(22) PCT Filed: Dec. 28, 2005

(86) PCT No.: PCT/SE2005/002052
§ 371 (c)(1),
(2), (4) Date: Nov. 19, 2008

(87) PCT Pub. No.: WO2007/075131
PCT Pub. Date: Jul. 5, 2007

(65) Prior Publication Data
US 2009/0147411 A1 Jun. 11, 2009

(51) Int. Cl.
*H02H 3/00* (2006.01)
(52) U.S. Cl. .......................................................... 361/16

(58) Field of Classification Search ...................... 361/16
See application file for complete search history.

(56) References Cited

U.S. PATENT DOCUMENTS 3,921,038 A * 11/1975 Kernick et al. ............... 361/100
5,804,949 A 9/1998 Othman et al.
6,404,656 B1 * 6/2002 Jonsson et al. .................. 363/57

FOREIGN PATENT DOCUMENTS

WO WO-9424752 A1 10/1994

OTHER PUBLICATIONS

PCT/ISA/210—International Search Report—Jul. 24, 2006.

\* cited by examiner

*Primary Examiner* — Stephen W Jackson
(74) *Attorney, Agent, or Firm* — Venable LLP; Eric J. Franklin

(57) ABSTRACT

A thyristor controlled series capacitor module including a capacitor connectable in series with a power line, a thyristor valve connected in parallel with the capacitor, a breaker connected in parallel with the thyristor valve, and an inductor. By providing a simplified breaker arrangement, the number of components is reduced.

4 Claims, 3 Drawing Sheets

THYRISTOR CONTROLLED SERIES CAPACITOR MODULE

CROSS-REFERENCE TO RELATED APPLICATIONS

This application is the national phase under 35 U.S.C. §371 of PCT/SE2005/002052 filed Dec. 28, 2005.

FIELD OF INVENTION

The present invention relates generally to the configuration of thyristor controlled series capacitors and more specifically to a thyristor controlled series capacitor module having a reduced number of components.

BACKGROUND

Thyristor controlled series capacitors (TCSC) are used in power systems as controllable devices connected in series with a power line. The control offered by TCSC is an "impedance" type control used for controlled series compensation.

A prior art TCSC module is shown in FIG. 1. The TCSC module comprises a capacitor 2 connected in series with a power line 4. In parallel with the capacitor 2 there is provided a thyristor valve 6 in series with an inductor 8. The thyristor valve in itself consists of two anti-parallel thyristors 6a, 6b in order to provide bi-directional functionality.

The TCSC module can operate in essentially three different modes. In a so-called bypassed mode, the thyristors are gated for full conduction and the TCSC module is slightly inductive because of the inductor in series with the thyristor valve. In a so-called inserted mode, the capacitor 2 is inserted by turning off the thyristor valve, i.e., blocking all gating signals to the thyristors. When the capacitor is inserted, the thyristors can be gated near the end of each half cycle in a manner that can circulate controlled amount of inductive current through the capacitor, thereby increasing the effective capacitive reactance of the module. This concept is referred to as vernier control.

In order to provide for bypassing of the TCSC module, three disconnectors 7-9 are provided as shown in FIG. 1. The term disconnector is intended in this description to refer to devices normally not capable of interrupting a current. In normal operation, the first and second disconnectors 7 and 8 are closed and disconnector 9 is open. In these positions, the disconnectors effectively connect the TCSC module in series with the power line 4.

The TCSC module shown in FIG. 1 can be exposed to short circuit currents during line faults, resulting in stresses on the capacitor. To cope with this situation, a first breaker 10 is provided in parallel with the thyristor valve 6. The term breaker is intended in this description to cover devices capable of breaking or interrupting a current. During short circuit faults, the first breaker 10 is closed in order to ensure that the inductance 8 is included for limitation of capacitor discharge current. The current path in this situation through the breaker 10 and thyristor valve 6 is shown in the figure with a dashed line.

To allow permanent bypass of the module in cases of internal fault or during maintenance, a second breaker 12 is provided in parallel with the capacitor 2. This second breaker, when closed, effectively bypasses the capacitor. The current path in this situation through the breaker 12 is shown in the figure with a continuous line. After the breaker 12 has been closed, the disconnector 9 is closed whereupon the breaker 12 is opened. Then, with all current flowing through disconnector 9 and no current through the TCSC module, the disconnectors 7 and 8 are opened. In this way, the TCSC is effectively disconnected from the power line 4.

Finally, the TCSC module shown in FIG. 1 comprises a varistor 14 connected in parallel with the capacitor 2. The varistor, being a power surge protection device, protects the capacitor in case of a voltage spike appearing across the capacitor.

TCSC modules as many other power line components are subject to cost-reduction demands. Thus, the provision of two different breakers contributes to the overall cost of the TCSC module and is in itself a problem. Also, as the number of components included in the TCSC module increases, so is the probability of internal faults.

A further problem with the configuration of FIG. 1 is the fact that when operating in thyristor bypass mode, the fault current will flow through the inductor 8, resulting in magnetic energy and voltage drop.

A special difficulty arises when restoring normal operation and line current shall be commutated from breaker 12 to breaker 10, since the breaker 10 path includes the inductor 8. In order to be able to open breaker 12 this breaker has to have sufficient breaking capability; a disconnect switch would not be sufficient.

SUMMARY OF THE INVENTION

An object of the present invention is to provide a TCSC module having a reduced number of components as compared to prior art TCSC modules.

The invention is based on the realization that by reconfiguring the other components of the TCSC module, one of the prior art breakers can be dispensed with.

The above object, among others, is according to the invention attained by a TCSC module.

Further preferred embodiments are defined by the dependent claims.

By providing the inductor in series with the capacitor and by connecting the capacitor and inductor in parallel with the thyristor valve, the above mentioned problems are avoided or at least mitigated. A module is provided which comprises just one breaker, reducing cost and increasing reliability. Also, the problem with commutating currents from one breaker to another is also avoided since there is just one breaker.

BRIEF DESCRIPTION OF DRAWINGS

The invention is now described, by way of example, with reference to the accompanying drawings, in which.

DETAILED DESCRIPTION OF PREFERRED EMBODIMENTS

In the following a detailed description of preferred embodiments of a TCSC module according to the present invention will be given.

Figure 1:
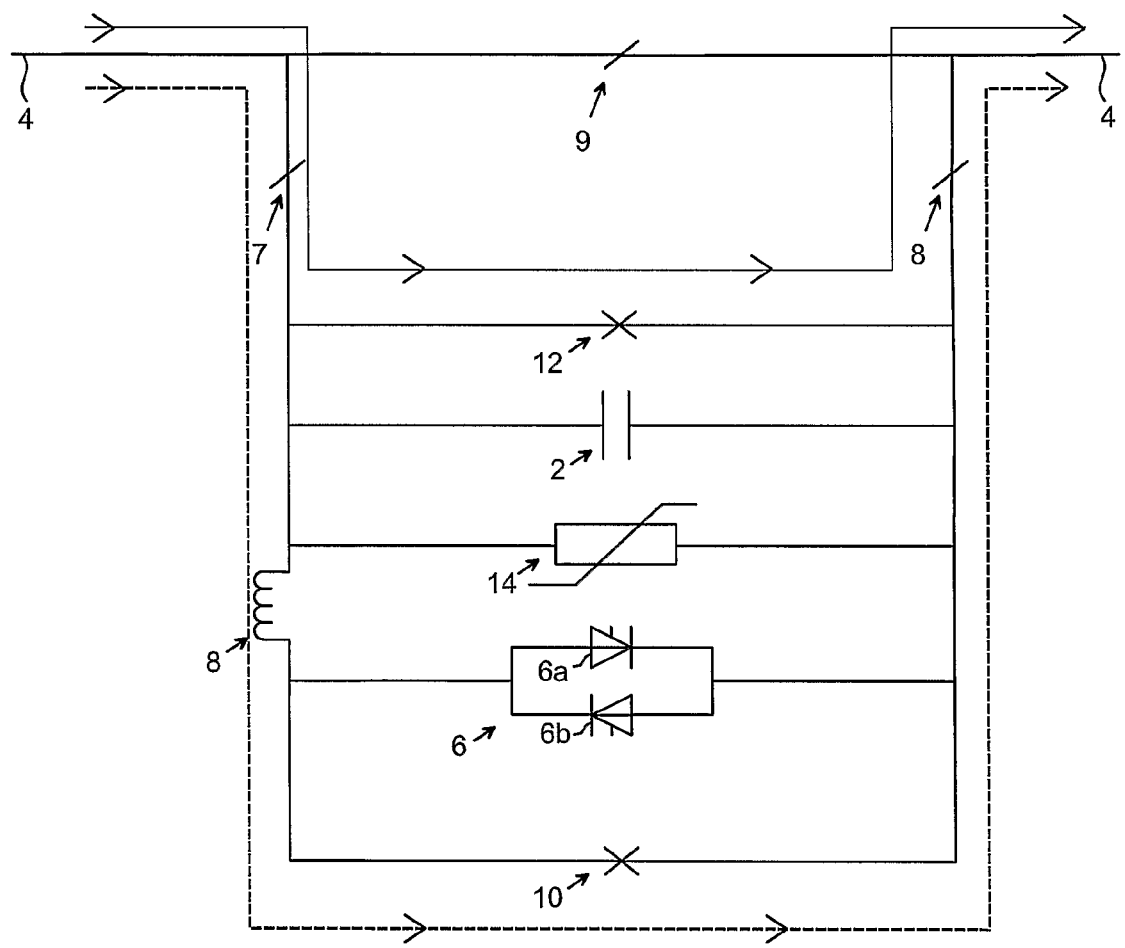
FIG. 1 shows a prior art TCSC module.

FIG. 1 has been covered in the background section of the description and will not be described further herein.

Figure 2:
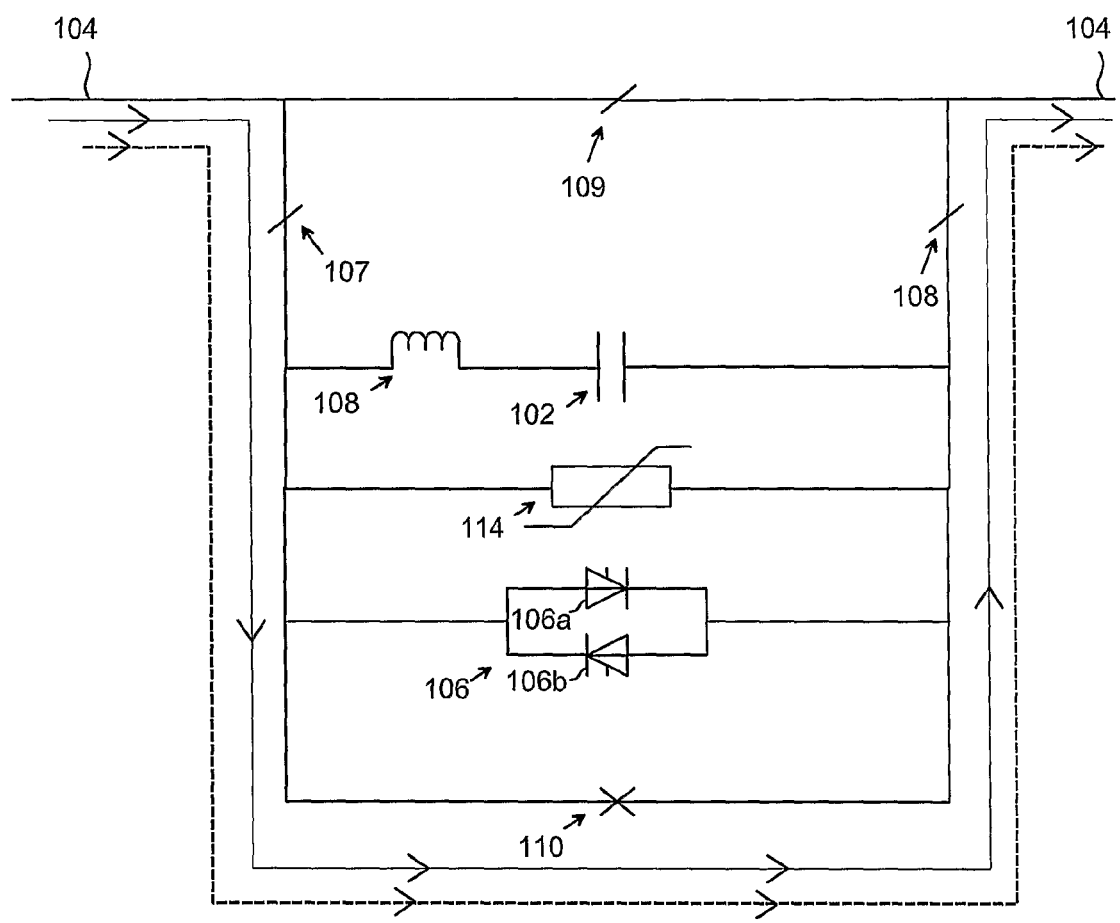
FIG. 2 shows a TCSC module according to the present invention.

FIG. 2 shows a TCSC module according to the present invention. It is in many aspects similar to the prior art module of FIG. 1. Thus, the TCSC module comprises a capacitor 102 connected in series with a power line 104. In parallel with the capacitor 102 there is provided a thyristor valve 106. The thyristor valve in itself consists of two anti-parallel thyristors 106a, 106b in order to provide bi-directional functionality. Like prior art modules, the TCSC module of FIG. 2 can operate in essentially three different modes: bypassed mode, inserted mode, and under vernier control.

The TCSC module is connected to the power line 104 by means of two disconnectors 107, 108. A third disconnector 109 is provided in series with the power line.

Also the TCSC module shown in FIG. 2 can be exposed to short circuit currents during line faults, resulting in stresses on the capacitor. To cope with this situation, a breaker 110 is provided in parallel with the thyristor valve 106. During short circuit faults, the breaker 110 is closed. The current path in this situation through the breaker 110 and thyristor valve 106 is shown in the figure with a dashed line. The inductance 108 is in this situation included in the path of the capacitor discharge current and thereby limits this current to avoid detrimental current peaks.

To allow permanent bypass of the module in cases of internal fault or during maintenance, the breaker 110 is provided in parallel with the capacitor 102, too. By this configuration, the breaker, when closed, effectively bypasses the capacitor. The current path in this situation through the breaker 110 is shown in the figure with a continuous line.

In other words, when the breaker is closed, the path through the breaker forms a current path both during short circuit faults on the power line and during bypass operation of the module.

Like in the prior art module shown in FIG. 1, the TCSC module shown in FIG. 2 comprises a varistor 114 connected in parallel with the capacitor 102 to protect it in case of power surges.

The configuration of FIG. 2 consequently allows simplification of the bypass breaker arrangement. Furthermore, the voltage stresses during a line fault are reduced when operating in thyristor bypass mode since the inductor is not included in the line current path.

Figure 3:
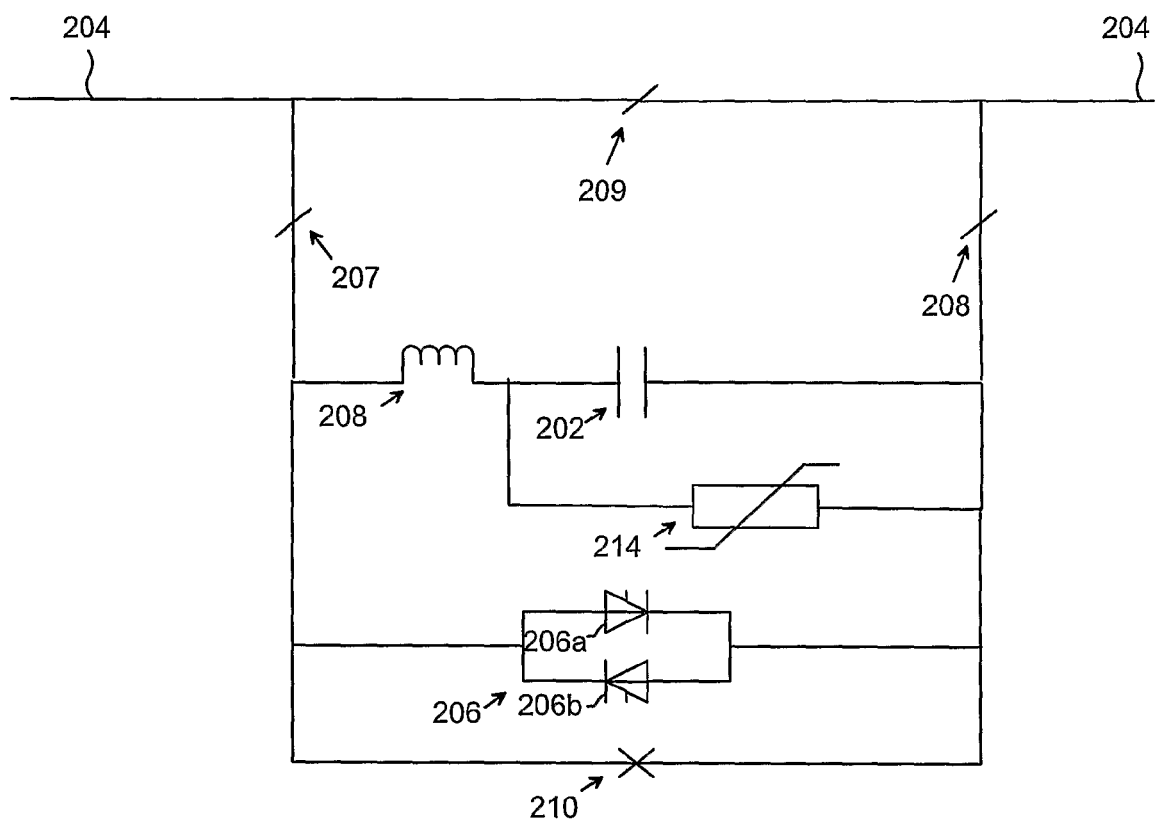
FIG. 3 shows an alternative embodiment of a TCSC module according to the invention.

In an alternative embodiment of a TCSC module according to the invention, which is shown in FIG. 3, the varistor has been provided directly in parallel with the capacitor. This provides the benefit of increased protection for the capacitor. In all other aspects, this embodiment is identical to the embodiment shown in FIG. 2.

Preferred embodiments of a TCSC module according to the present invention has been described. A person skilled in the art realizes that these could be varied within the scope of the appended claims.

The invention claimed is:

1. A thyristor controlled series capacitor module, comprising:
   a capacitor connectable in series with a power line;
   a thyristor valve connected in parallel with the capacitor;
   a breaker connected in parallel with the thyristor valve; and
   an inductor;
   wherein the inductor is connected in series with the capacitor; wherein the serial connected capacitor and inductor are connected in parallel with the thyristor valve, and wherein a path through the breaker, when the breaker is closed, forms a current path during short circuit faults on the power line and during bypass operation of the module.

2. The module according to claim 1, wherein the thyristor valve comprises two anti-parallel thyristors.

3. The module according to claim 1, further comprising:
   a varistor connected in parallel with the capacitor.

4. A method of controlling a thyristor controlled series capacitor module, the module comprising an inductor connected in series with a capacitor and connectable in series with a power line, a thyristor valve connected in parallel with the inductor and capacitor, and a breaker connected in parallel with the thyristor valve, the method comprising:
   in normal operation, keeping the breaker open;
   upon short circuit faults on the power line, closing the breaker and keeping the breaker closed; and
   during bypass operation of the module, closing the breaker and keeping the breaker closed.

* * * * *

UNITED STATES PATENT AND TRADEMARK OFFICE
CERTIFICATE OF CORRECTION

PATENT NO. : 8,081,406 B2
APPLICATION NO. : 12/159766
DATED : December 20, 2011
INVENTOR(S) : Gunnar Ingeström et al.

It is certified that error appears in the above-identified patent and that said Letters Patent is hereby corrected as shown below:

Please change Title page item (73) from

"(73)  Assignee:  ABB Research Ltd., Linköping (SE)"

to

--(73)  Assignee:  ABB Research Ltd., Zürich (CH)--

Signed and Sealed this
Fourteenth Day of May, 2013

Teresa Stanek Rea
*Acting Director of the United States Patent and Trademark Office*